(12) United States Patent
Fukuda

(10) Patent No.: US 6,697,292 B1
(45) Date of Patent: Feb. 24, 2004

(54) SEMICONDUCTOR MEMORY DEVICE CAPABLE OF CHANGING THE SELECTION ORDER OF SENSE AMPLIFIERS

(75) Inventor: Ryo Fukuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/462,695

(22) Filed: Jun. 17, 2003

(30) Foreign Application Priority Data

Mar. 31, 2003 (JP) ........................................ 2003-095401

(51) Int. Cl.$^7$ .............................................. G11C 29/00
(52) U.S. Cl. .................. 365/201; 365/200; 365/230.06; 365/225.7; 365/189.07
(58) Field of Search ................................ 365/200, 201, 365/190, 230.06, 225.7, 189.07

(56) References Cited

U.S. PATENT DOCUMENTS 6,388,934 B1 * 5/2002 Tobita ......................... 365/222

OTHER PUBLICATIONS

Beom–Jun Jin, et al., "DRAM Scaling–Down to 0.1μm Generation using Bitline Spacerless Storage Node SAC and RIR Capacitor with TiN Contact Plug", 2001 Symposium on VLSI Technology Digest of Technical Papers, 2001, pp. 127–128.

Paul DeMone, et al., "A 6.25 ns Random Access 0.25 μm Embedded DRAM", 2001 Symposium on VLSI Circuits Digest of Technical Papers, 2001, pp. 237–240.

* cited by examiner

Primary Examiner—Andrew Q. Tran
(74) Attorney, Agent, or Firm—Oblon, Spivak, McClelland, Maier & Neustadt, P.C.

(57) ABSTRACT

A semiconductor memory device comprising a plurality of memory cells to store data, k data input/output lines (k=a natural number), a plurality of sense amplifiers which are provided in n number (n=a natural number) for the k data input/output lines, and perform reading and writing cell data for the plurality of memory cells, a column selection gate which selects one sense amplifier among the n sense amplifiers, and connects the selected sense amplifier to the corresponding data input/output line, a selector circuit which controls the column selection gate, and sequentially selects m sense amplifiers (m=1, 2, . . . , n) among the n sense amplifiers, and a switching circuit which changes the order of selecting the m sense amplifiers by the selector circuit.

18 Claims, 11 Drawing Sheets

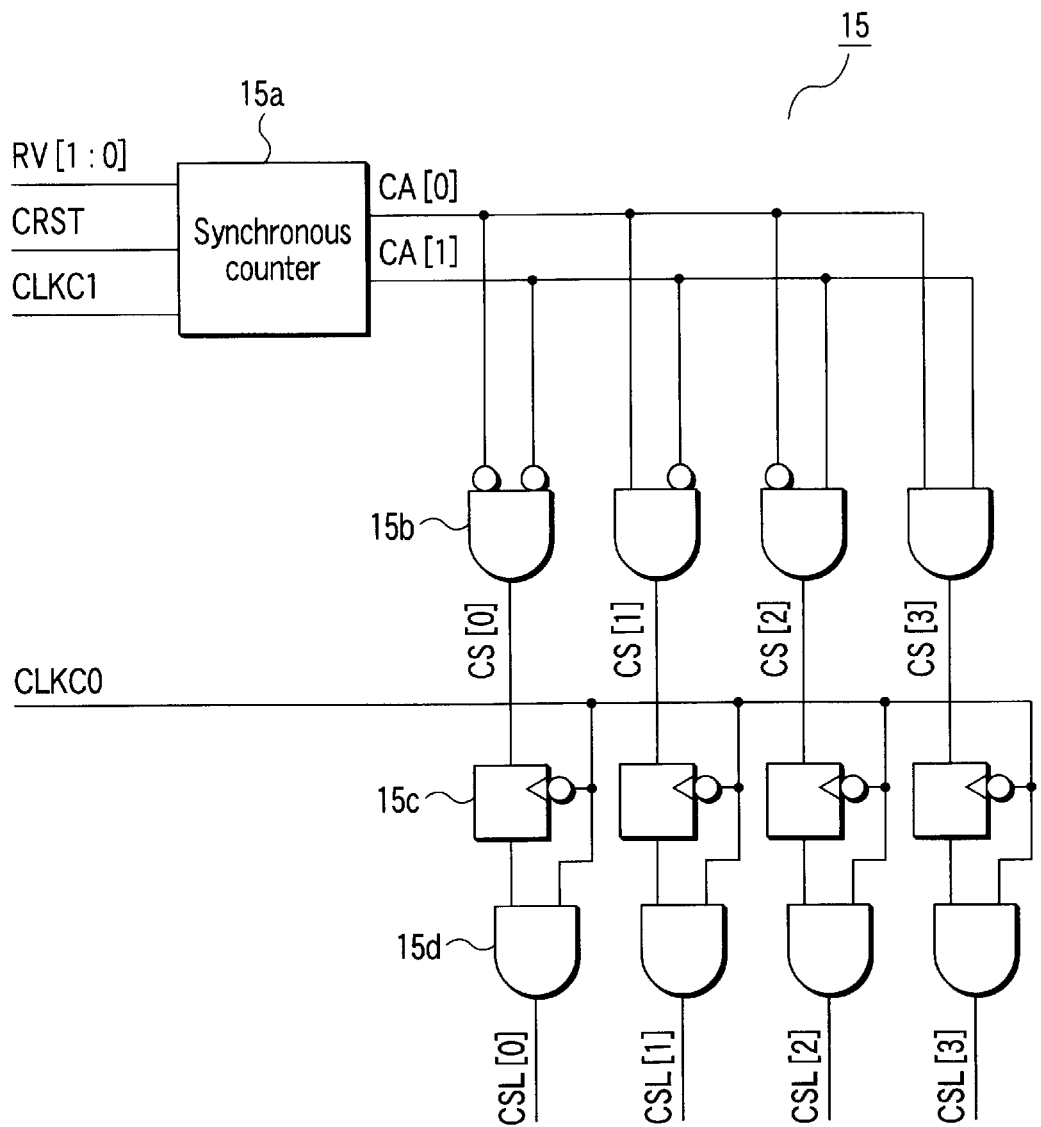
F I G. 2

SEMICONDUCTOR MEMORY DEVICE CAPABLE OF CHANGING THE SELECTION ORDER OF SENSE AMPLIFIERS

CROSS-REFERENCE TO RELATED APPLICATIONS

This application is based upon and claims the benefit of priority from the prior Japanese Patent Application No. 2003-095401, filed on Mar. 31, 2003, the entire contents of which are incorporated herein by reference.

BACKGROUND OF THE INVENTION

1. Field of the Invention

The present invention relates to a semiconductor memory device, and column selecting and testing methods of the device. More particularly, the invention is concerned with a semiconductor memory device which can sequentially access the m sense amplifiers (m=1, 2, ... n) among n sense amplifiers (n is a natural number) connected to one data input/output line, in time series, without specifying from the outside of the device.

2. Description of the Related Art

Recently, in a high-speed and highly integrated semiconductor memory device, as the wiring resistance and contact resistance caused by shrinkage increase, the resistance of the elements tends to increase. Conversely, the device operating speed tends to increase as the transistor operating speed increases. Particularly, in DRAM (Dynamic Random Access Memory), there is a problem of an insufficient data writing error caused by the resistance on the route of accessing a memory cell (e.g., refer to "DRAM scaling-down 0.1 $\mu$m generation using bitline spacerless storage node SAC and RIR capacitor with TiN contact plug", Beom-Jun, Jin et al, Symposium on VLSI Technology. Digest of Technical Papers, pp. 127–128, and "A 6.25 ns random access 0.25 $\mu$m embedded DRAM", DeMone, P. et al, Simposium on VLSI Circuits Digest of Technical Papers, 2001, pp. 237–240).

Generally, a highly integrated semiconductor memory device employs redundancy technology to replace a defective cell with a redundant cell. Even for the above-mentioned cell with defective-resistance (hereinafter, referred to as a high resistance cell), usually, a replacement method using a spare row or column cell is adopted. However, in addition to a decrease of yield due to the cell's own defect, the yield will also be decreased by replacing a high-resistance cell by a spare cell. Further, in most cases, a high-resistance cell is found only by a high speed test, and is difficult to be found by a test using a low speed tester that is usually used for detection of defects. Moreover, there is a problem that a high resistance cell will become defective even if a test is performed with a high speed tester after packaging.

Further, in order for a semiconductor memory device to cover an increase in the required memory capacity and delay in the latency of memory cells, in recent semiconductor memory devices, it is often demanded to sequentially access a plurality of sense amplifiers connected to the same data input/output line, in time series, without specifying from outside the device.

FIG. 12 shows a configuration of the essential parts of a semiconductor memory device (e.g., DRAM) for which the above-mentioned operation is demanded. In FIG. 12, a reference numeral 101 denotes a memory cell. One memory cell 101 stores 1-bit cell data. In this example, each memory cell 101 is connected to one of multiple word lines WL [j] (j=0, ..., j–1) and one of eight bit lines BL [i] (i=0, ...,7). The bit lines BL [0] to BL [7] are connected to eight sense amplifiers 102 (102a to 102h). Reading and writing the cell data for each memory cell 101 are performed through each sense amplifier 102a to 102h.

The reference numerals 103a and 103b denote a sense amplifier writing/reading circuit. The sense amplifier writing/reading circuit 103a is connected to an external data input/output line DIa/DOa (an external data input line DIa/external data output line DOa) and an internal data line DQa. The sense amplifier writing/reading circuit 103b is connected to an external data input/output line DIb/DOb (an external data input line DIb/external data output line DOb) and an internal data line DQb. In this example, one internal data line DQa is connected to four sense amplifiers 102a to 102d through a column selection gate 104. The other internal data line DQb is connected to four sense amplifiers 102e to 102h through a column selection gate 104. Namely, among the eight sense amplifiers 102a to 102h, the four sense amplifiers 102a to 102d connected to the bit lines BL [0] to BL [3] are connected commonly to the same external data input/output lines DIa and DOa. Similarly, the four sense amplifiers 102e to 102h connected to the bit lines BL [4] to BL [7] are commonly connected to the same external data input/output lines DIb/DOb.

The column selection gate 104 includes eight NMOS transistors. Among these eight NMOS transistors, the drains of four NMOS transistors are connected to the bit lines BL [0] to BL [3]. Each source is commonly connected to one internal data line DQa, and the gates are connected to the column selection lines CSL [0] to CSL [3]. Similarly, the drains of the other four NMOS transistors are connected to the bit lines BL [4] to BL [7], and each source is commonly connected to the other internal data line DQb, and the gates are connected to the column selection lines CSL [0] to CSL [3], respectively.

A reference numeral 105 denotes a column selector circuit. The column selector circuit 105 selects one of the column selection lines CSL [0] to CSL [3] on the time series according to a clock signal CLKC and a control signal.

FIG. 13 shows one memory cell taken out of the above-mentioned DRAM. The above-mentioned bit line BL [i] and the above-mentioned internal data lines DQa/DQb are actually complementary. For example, as shown in FIG. 13, the bit line BL [0] consists of bit lines BLt [0] and BLc [0] (or, BLt/c [0]). The internal data line DQa consists of internal data lines DQta and DQca (or, DQt/ca).

The memory cell 101 is connected to one of the bit line BLt [0] and bit line BLc [0]. (In this example, the memory cell 101 is connected to the bit line BLt [0].) The memory cell 101 has a cell transistor $101_{-1}$ and a cell capacitor $101_{-2}$. The cell transistor $101_{-1}$ is an NMOS transistor, whose source is connected to the bit line BLt [0] and the gate is connected to the word line WL [j], respectively. The drain of the NMOS transistor is connected to one end of the cell capacitor $101_{-2}$, and functions as a storage node (SN). The other end of the cell capacitor $101_{-2}$ is connected to a fixed potential (VPL). Writing the cell data is realized by storing electric charges in the cell capacitor $101_{-2}$. For the electric charge holding characteristic of the cell capacitor $101_{-2}$, a negative fixed voltage (VBB) is usually applied to the back bias terminal of the cell transistor $101_{-1}$.

The sense amplifier 102a is connected to the bit lines BLt [0] and BLc [0], respectively. As a sense amplifier 102a, for example, a dynamic latch type circuit is used.

The column selection gate 104 includes two NMOS transistors, whose drains are connected to the bit lines BLt [0] and BLc [0]. Each gate is commonly connected to the column selection line CSL[0], and the sources are connected to the internal data lines DQta and DQca, respectively. The internal data lines DQta and DQca are connected to the above-mentioned sense amplifier writing/reading circuit 103a, as shown in FIG. 12.

FIG. 14 shows the operation of the DRAM configured as mentioned above. CLK is an operation clock necessary for operating the DRAM. COM is a command signal supplied from an external device. A read command (R) or a write command (W) is inputted at a certain timing. Here, description will be given on the case where the write command (W) is inputted. A row address to activate is also inputted, but it is omitted here. BLt/c [0] and BLt/c [3] are signal waveforms of the bit lines BLt [0], BLc [0] and bit lines BLt [3], BLc [3], when the memory cell is connected to the bit lines BLc [0] and BLt [3]. The signal amplitude (swing width) of the bit line BL [i] is VBLH potential (about 1.5V in the current generation). VSN is a potential of a storage node SN of each memory cell 101.

When the command signal COM is entered, the word line WL [j] corresponding to the address is activated. For example, assuming that the word line WL is activated, the cell data of the corresponding memory cell 101 will be outputted to the bit line BLc [0] and BLt [3]. In this example, the cell data "0" is read out to the both. When the cell data is read out to each BLc [0] and BLt [3], the sense amplifier 102 is activated. Thus, the potential of the bit lines BLt/c [0] and BLt/c [3] is amplified. Thereafter, synchronizing with the operation clock CLK, the column selection lines CSL [0], CSL [1], CSL [2] and CSL [3] will be sequentially activated. During this period, the potential of the internal data line DQa varies as indicated by D0 to D3, corresponding to the potential D0 to D3 of the external data input line DIa.

In this state, first, the column selection line CSL [0] is activated. Then, the amplified potential of the bit line BLt/c [0] is inverted, and the cell data "1" is written in the memory cell 101. At this time, the potential of the bit line BLc [0] quickly becomes close to the VBLH potential. However, the potential VSN of the storage node SN requires much time to become the VBLH potential, because of the contact resistance of the cell transistor $101_{-1}$ and bit line BLt/c [0], and the resistance caused by junctions in the route to the storage node SN. A dotted line indicates the potential VSN of the storage node SN, when a normal cell is used. A chain line indicates the potential VSN of the storage node SN when a high-resistance cell with a higher resistance than that of a normal cell is used.

After the column selection lines CSL [1] and CSL [2] are sequentially activated, the column selection line CSL [3] is activated last. Then, the amplified potential of the bit line BLt/c [3] is inverted, and the cell data "1" is written in the memory cell 101. At this time, the potential of the bit line BLt [3] quickly becomes close to the VBLH potential.

Leaving time for data-writing, the word line WL and sense amplifier 102 are deactivated. Then, the bit lines BLt/c [0] and BLt/c [3] are equalized (about the potential of VBLH/2) to prepare for the next reading operation. When the word line WL is deactivated, a rise in the potential of the storage node SN is suppressed.

Since the column selection line CSL [0] is activated at an early time, the potential VSN of the storage node SN becomes sufficiently close to the VBLH potential, and the memory cell 101 connected to the bit line BLc [0] rarely becomes a defective cell, even if it is a high-resistance cell. Contrarily, as to the memory cell 101 connected to the bit line BLt [3], the time from activation of the column selection line CSL [3] to deactivation of the word line WL is short, and the potential VSN written in the storage node SN is likely to become short. Especially, in a high-resistance cell, the potential VSN of the storage node SN is further decreased, and the cell easily becomes defective because of the pause characteristic or the time to the next access and the noise during reading.

As in a high resistance cell, a cell with defective-resistance which fails due to an insufficient data writing error, caused by the insufficient potential of the storage node SN, is replaced by a spare row or column cell.

As explained above, in the prior art, when a cell that is defective in resistance is to be replaced by a row or column spare cell, a problem arises in a test, and a yield decreases.

BRIEF SUMMARY OF THE INVENTION

According to a first aspect of the present invention, there is provided a semiconductor memory device comprising: a plurality of memory cells to store data; k data input/output lines (k=a natural number); a plurality of sense amplifiers which are provided in n number (n=a natural number) for the k data input/output lines, and perform reading and writing cell data for the plurality of memory cells; a column selection gate which selects one sense amplifier among the n sense amplifiers, and connects the selected sense amplifier to the corresponding data input/output line; a selector circuit which controls the column selection gate, and sequentially selects m sense amplifiers (m=1, 2, ..., n) among the n sense amplifiers; and a switching circuit which changes the order of selecting the m sense amplifiers by the selector circuit.

According to a second aspect of the present invention, there is provided a column selecting circuit comprising: a plurality of memory cells to store data; k data input/output lines (k=a natural number); a plurality of sense amplifiers which are provided in n number (n=a natural number) for the k data input/output lines, and perform reading and writing cell data for the plurality of memory cells; a column selection gate which selects one sense amplifier among the n number of sense amplifiers, and connects the selected sense amplifier to the corresponding data input/output line; a selector circuit which controls the column selection gate, and sequentially selects m sense amplifiers (m=1, 2, ..., n) among the n sense amplifiers; and a switching circuit which changes the order of selecting the m sense amplifiers by the selector circuit; wherein the order of selecting columns by the selector circuit is changed according to a reset value signal from the switching circuit.

According to a third aspect of the present invention, there is provided a method of testing a semiconductor memory device comprising: a plurality of memory cells to store data; k data input/output lines (k=a natural number); a plurality of sense amplifiers which are provided in n number (n=a natural number) for the k data input/output lines, and perform reading and writing cell data for the plurality of memory cells; a column selection gate which selects one sense amplifier among the n number of sense amplifiers, and connects the selected sense amplifier to the corresponding data input/output line; a selector circuit which controls the column selection gate, and sequentially selects m sense amplifiers (m=1, 2, ... n) among the n sense amplifiers; and a setting circuit which sets the order of selecting the m sense amplifiers by the selector circuit; wherein whether a high-resistance cell with higher resistance than that of a normal cell can be prevented from becoming defective, is tested by changing the order of selecting columns by the selector circuit, according to the set value of the setting circuit.

BRIEF DESCRIPTION OF THE SEVERAL VIEWS OF THE DRAWING

FIG. 2 is a circuit diagram showing a configuration of a column selection order switching circuit in the DRAM of FIG. 1;

DETAILED DESCRIPTION OF THE INVENTION

Embodiments of the present invention will be described in further detail with reference to the accompanying drawings.

First Embodiment

Figure 1:
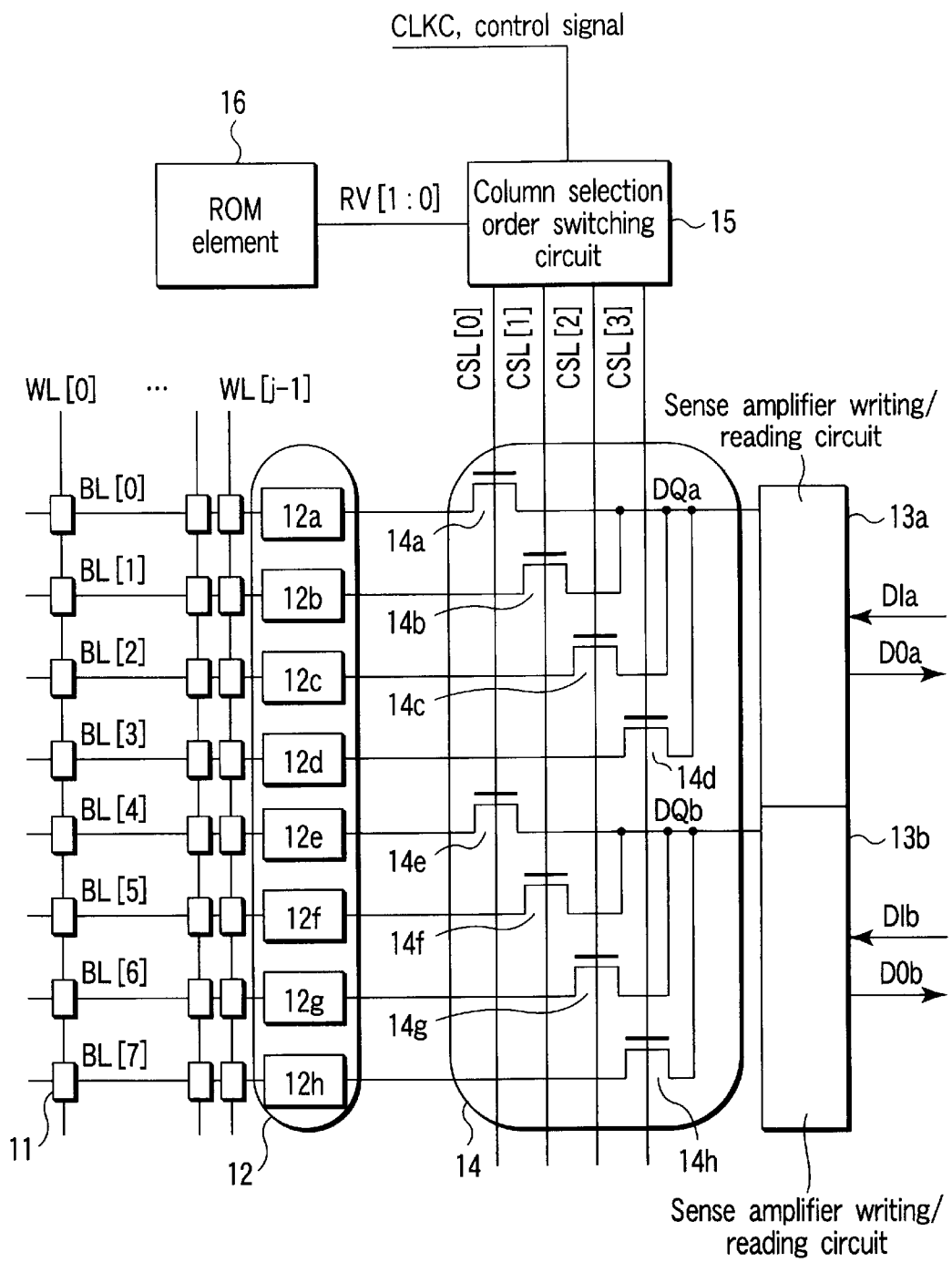
FIG. 1 is a block diagram showing the several parts of a DRAM according to a first embodiment of the present invention.

FIG. 1 is a block diagram showing the several parts of a semiconductor memory device (e.g., DRAM) according to a first embodiment of the present invention. The DRAM is configured to sequentially access the m sense amplifiers (m=1, 2, . . . , n) among the n sense amplifiers (n=a natural number) connected to the same data input/output line, on the time series without specifying from the outside of the device. Description will be given on the case where four (n) sense amplifiers are connected to two (k) data input/output lines (k=a natural number).

Namely, each memory cell 11 can store 1-bit cell data. Each memory cell 11 is connected one of multiple word lines WL [j] (j=0, . . . , j−1) and one of eight bit lines BL [i] (i=0, . . . , 7), respectively. Each bit lines BL [0] to BL [7] is connected to the sense amplifiers 12 (12a to 12h). Reading and writing the cell data for the memory cell 11 are performed through the sense amplifiers 12a to 12h. The sense amplifiers 12a to 12h amplify and read the cell data of each memory cell 11, and amplify the cell data to be written in each memory cell 11.

There are two sense amplifier writing/reading circuits, 13a and 13b. The sense amplifier writing/reading circuit 13a is connected to an external data input/output line DIa/DOa, comprising an external data input line DIa and an external data output line DOa, and an internal data line DQa. The sense amplifier writing/reading circuit 13b is connected to an external data input/output line DIb/DOb, comprising an external data input line DIb and an external data output line Dob, and an internal data line DQb. In this example, one internal data line DQa is connected to four sense amplifiers 12a to 12d through a column selection gate 14. The other internal data line DQb is connected to four sense amplifiers 12e to 12h through a column selection gate 14. Namely, the external data input/output line DIa/DOa are commonly provided for the four sense amplifiers 12a to 12d among the eight sense amplifiers 12a to 12h. Similarly, the external data input/output lines DIb/DOb are commonly provided for the four sense amplifiers 12e to 12h.

A column selection gate 14 includes eight NMOS transistors 14a to 14h. The drains of four NMOS transistors 14a to 14d of the eight NMOS transistors are connected to the bit lines BL [0] to BL [3]. Each source is commonly connected to one internal data line DQa, and the gates are connected to the column selection lines CSL [0] to CSL [3]. Similarly, the drains of the other four NMOS transistors 14e to 14h are connected to the bit lines BL [4] to BL [7], and each source is commonly connected to the other internal data line DQb, and the gates are connected to the column selection lines CSL [0] to CSL [3].

One end of the column selection lines CSL [0] to CSL [3] is connected to the column selection order switching circuit (a selector circuit) 15. The column selection order switching circuit 15 selects one of the column selection lines CSL [0] to CSL [3], on the time series by controlling the column selection gate 14 according to a clock signal CLKC and a control signal. The column selection order switching circuit 15 is configured to change the order of the column selection lines CSL [0] to CSL [3], according to the reset value RV [1:0] (=RV value "00", "01", "10", "11") from a ROM element (a switching circuit) 16, when selecting one of the column selection lines.

The reset value RV [1:0] is stored in the above-mentioned ROM element 16 comprising a non-volatile memory such as fuse elements and EEPROM. The reset value RV [1:0] is the defect data (the address data of a high-resistance cell) or the result of the test executed by a test circuit (not shown) mounted on the same chip before packaging the device, for example.

When the reset value RV [1:0] is "00", the column selection lines CSL [0] to CSL [3] are selected by the column selection order switching circuit 15, in the order of CSL [0], CSL [1], CSL [2] and CSL [3], for example. When the reset value RV is "01", the column selection lines are selected in the order of CSL [1], CSL [2], CSL [3] and CSL [0], for example. When the reset value RV is "10", the column selection lines are selected in the order of CSL [2], CSL [3], CSL [0] and CSL [1], for example. When the reset value RV is "11", the column selection lines are selected in the order of CSL [3], CSL [0], CSL [1] and CSL [2], for example.

Figure 13:
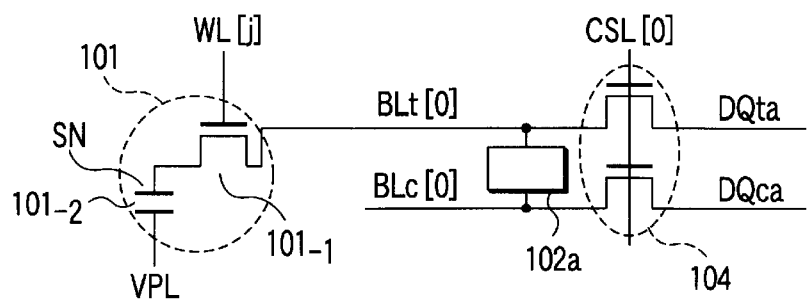
FIG. 13 is a block diagram showing the periphery of the cell in the DRAM of FIG. 12.
Figure 14:
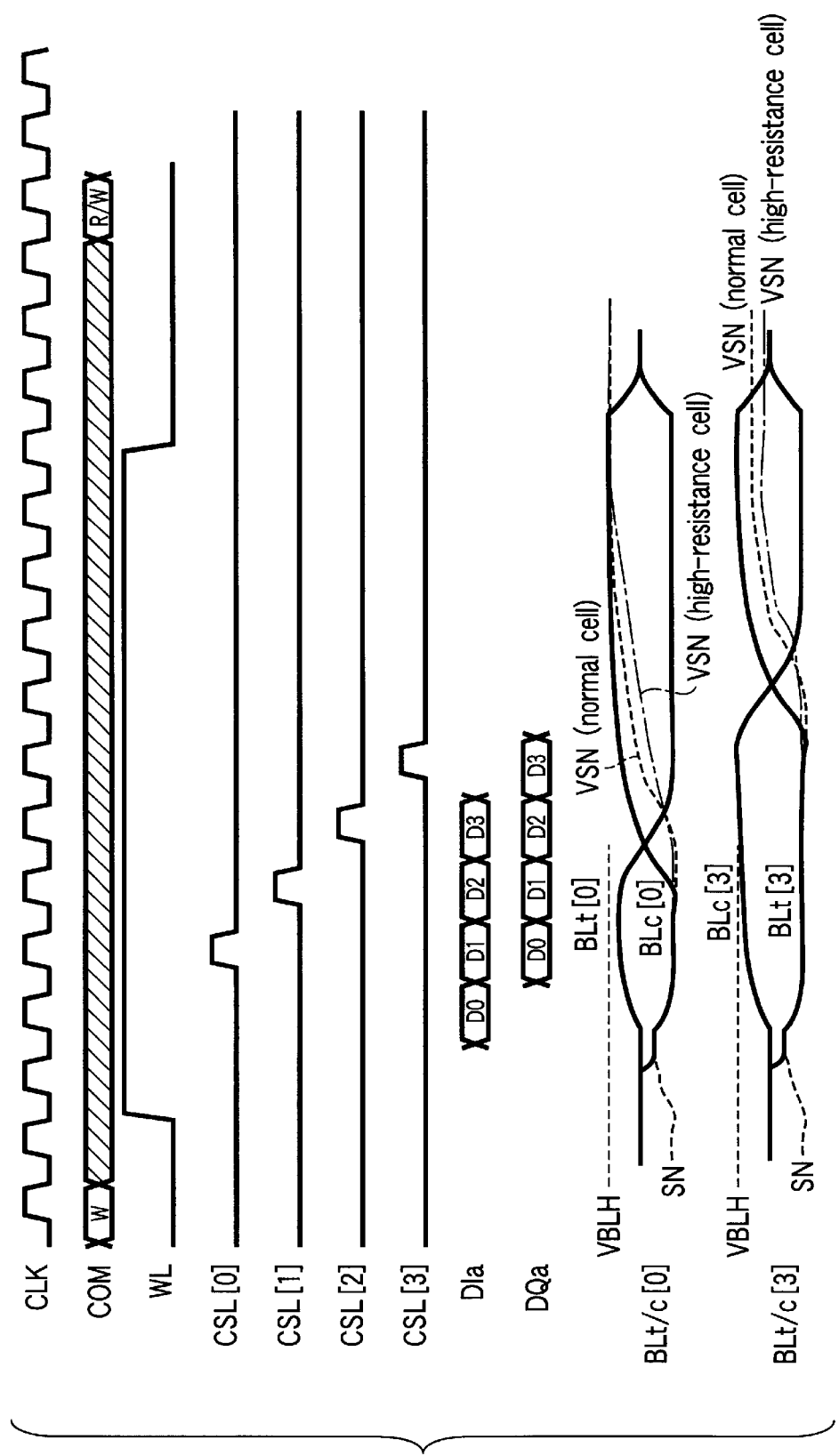
FIG. 14 is a timing chart explaining an example of operation in the DRAM of FIG. 12.

The bit line BL [i] and internal data line DQa/DQb are actually complementary, as shown in FIG. 13.

FIG. 2 shows a configuration example of a column selection order switching circuit. The column selection order switching circuit 15 comprises one synchronous counter 15a, four decoders 15b, four latch circuits 15c, and four AND gates 15d. The synchronous counter 15a executes counting according to the clock signal CLKC1. CA [0] and CA [1] are the output values of the synchronous counter 15a, and CRST is a reset signal. When the clock signal CLKC1 is entered while the reset signal CRST is being activated ("HIGH"), the synchronous counter 15a sets the reset value RV [1:0] for the output values CA [0] and CA [1]. When the reset signal CRST is deactivated ("LOW"), the synchronous counter 15 sequentially increments the output values CA [0] and CA [1] according to the clock signal CLKC1. Each decoder 15b is configured to activate ("HIGH") one of the output values CS [0] to CS [3] according to the output values CA [0] and CA [1]. Each latch circuit 15c is a D-Latch, and latches the output values CS [0] to CS [3] of each decoder 15b when the clock signal CLKC0 as a timing signal is "HIGH", and throws the output values CS [0]=CS [3] when the clock signal CLKC0 is "LOW". Each AND gate 15d activates the column selection line CSL [0] to [3] corresponding to the output values CS [0] to CS [3] of the activated decoder 15b, at the timing of rising edge of the clock signal CLKC0.

Figure 3:
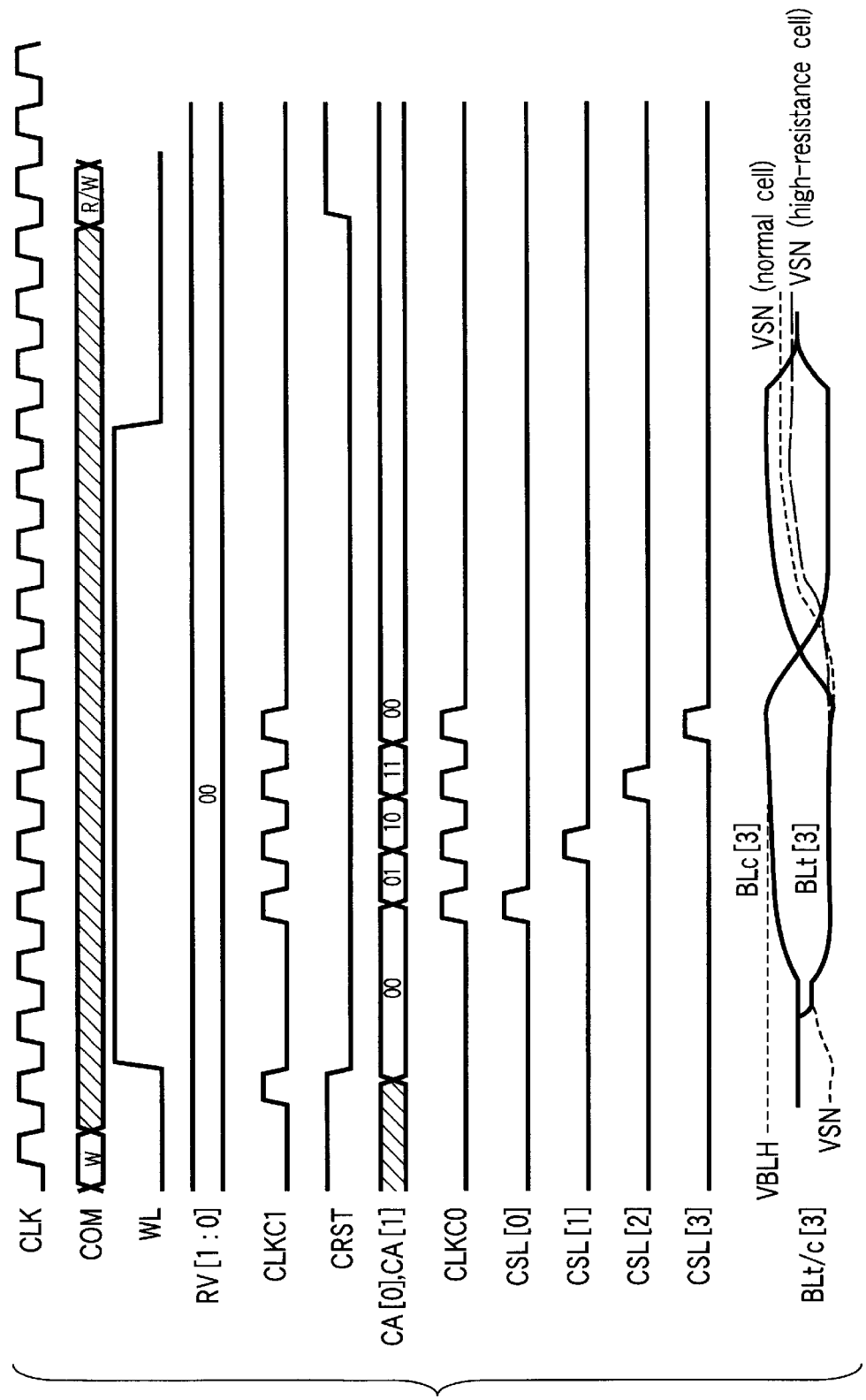
FIG. 3 is a timing chart explaining an example of operation in the DRAM of FIG. 1.
Figure 4:
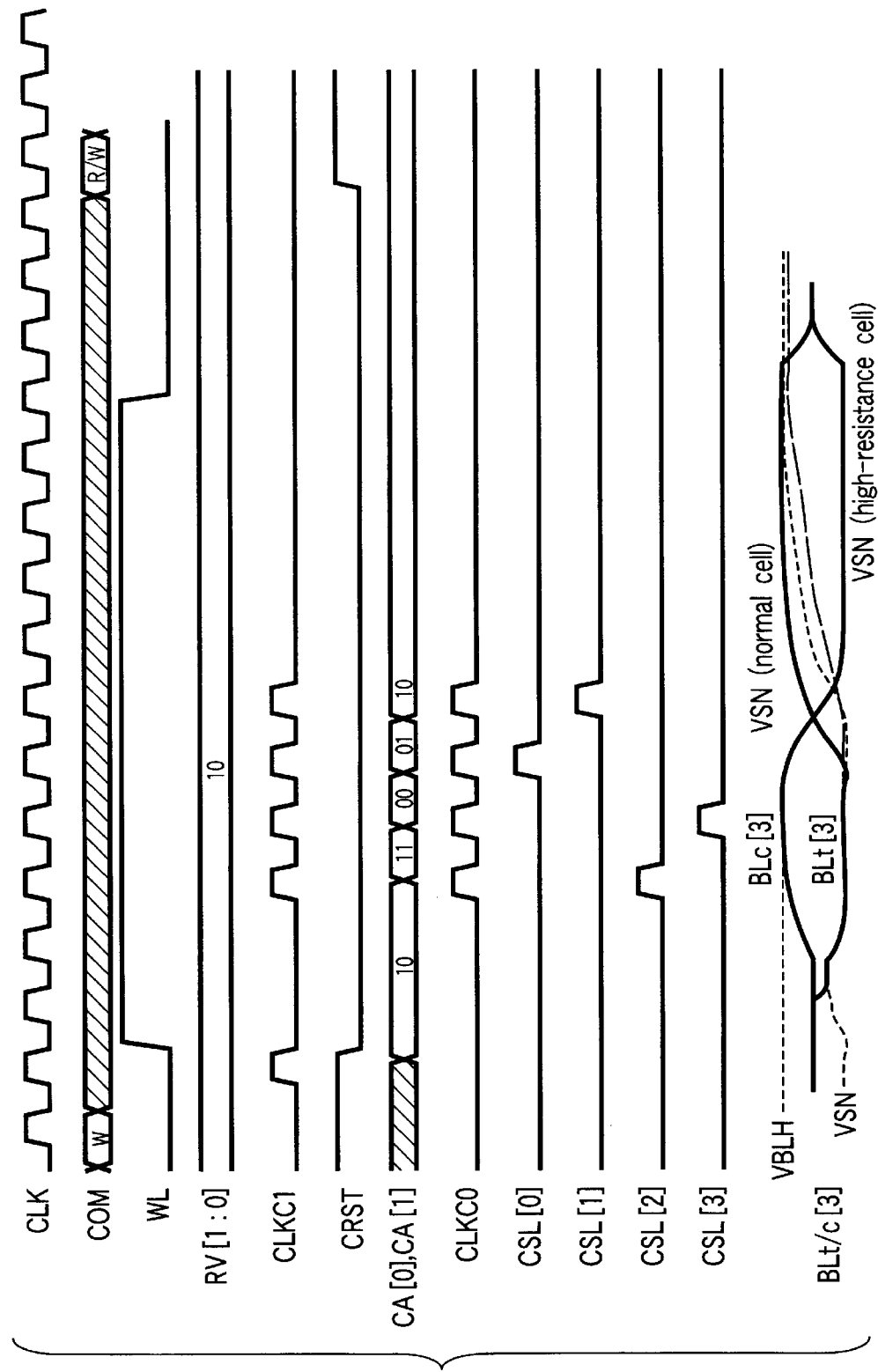
FIG. 4 is a timing chart explaining another example of operation in the DRAM of FIG. 1.

FIG. 3 and FIG. 4 explain the operation of the DRAM configured as explained above. FIG. 3 shows an example in which the ROM element 16 is not programmed. In this example, the reset value RV [1:0] is default "00".

CLK is an operation clock necessary for the DRAM operation. COM is a command signal supplied from outside the device. A read command (R) or a write command (W) is entered at a certain timing. Here, explanation will be given of the case where the write command (W) is entered. A row address to activate is also entered, but omitted here. BLt\c [3] is a signal waveform of bit lines BLt [3] and BLc [3], when the memory cell 11 is connected to the bit line BLt [3]. The signal amplitude (swing width) of the bit line BL [i] is VBLH potential (about 1.5V in the current generation). VSN is the potential of the storage node SN of the memory cell 11.

When the command signal COM is entered, a clock pulse occurs in the clock signal CLKC1. The reset signal CRST starts in the "HIGH" state, and held "HIGH" even when the clock pulse occurs in the clock signal CLKC1. Synchronizing with the clock pulse of the clock signal CLKC1, the synchronous counter 15a takes in the RV value "00" as a reset value RV [1:0] from the ROM element 16. As the reset signal CRST is "HIGH", the synchronous counter 15a sets the taken-in RV value "00" for the output values CA [0] and CA [1]. The synchronous counter 15a outputs the set output values CA [0] and CA [1] to each decoder 15b.

Since a clock pulse does not occur in the clock signal CLKC0 at this timing, the output values CA [0] and CA [1] of the synchronous counter 15a are transmitted only to each decoder 15b, and the column selection lines CSL [0] to CSL [3] are not activated. Thereafter, the reset signal CRST is set to "LOW". While the reset signal CRST is "LOW", the synchronous counter 15a merely increments the output values CA [0] and CA [1] sequentially according to the clock signal CLKC1.

On the other hand, when the command signal COM is entered, the word line WL [j] corresponding to the address is activated. For example, assuming that a word line WL is activated, the cell data of the memory cell 11 connected to that word line WL is outputted to the bit line BLt [3]. In this example, the cell data "0" is read out. After the cell data is read out to the bit line BLt [3], the sense amplifier 12 is activated. Then, potential of the bit line BLt/c [3] is amplified.

Thereafter, synchronizing with the operation clock CLK, four clock pulses continuously occur in the clock signals CLKC0 and CLKC1. First, while the output values CA [0] and CA [1] of the synchronous counter 15a are "00", the latch circuit 15c and AND gate 15d are activated by the first clock pulse. Namely, the column selection line CSL [0] is activated.

Thereafter, by the incremental operation of the synchronous counter 15a, the output values CA [0] and CA [1] are set to "01". In this state, a clock pulse occurs in the clock signal CLKC0, and the column selection line CSL [1] is activated. Similarly, the column selection line CSL [2] is activated by setting "10" for the output values CA [1] and CA [1] of the synchronous counter 15a, and the column selection line CSL [3] is activated by setting "11" for the output values CA[1] and CA[1] of the synchronous counter 15a.

During this period, according to the potential of the external data input line DIa, the potential of the internal data line DQa is changed as indicated by D0 to D3. After this incremental operation is finished, the reset signal CRST is activated to "HIGH".

After sequentially activating the column selection lines CSL [0], CSL [1] and CSL [2], as explained above, the column selection line CSL [3] is activated last. Then, the amplified potential of the bit line BLt/c [3] is inverted, and the cell data "1" is written in the memory cell 11.

Leaving time for data writing, the word line WL and sense amplifier 12 are deactivated. Then, the bit line BLt/c [3] is equalized (about the potential of VBLH/2) to prepare for the next reading operation. When the word line WL is deactivated, a rise in the potential of the storage node SN is suppressed.

As explained above, when the memory cell 11 corresponding to the word line WL among the multiple memory cells 11 connected to the sense amplifier 12d is a normal cell, even if the time from activation of the column selection line CSL [3] to deactivation of the word line WL is short, the normal cell rarely becomes a defective cell.

Next, explanation will be given on the operation for prevent a high-resistance cell from becoming defective, in which a high resistance exists on the route of accessing the memory cell 11. FIG. 4 shows an example where the ROM element 16 is programmed by the reset value RV [1:0]. Explanation will be given on an example when the programmed reset value RV [1:0] is RV value "10".

When a high-resistance cell is detected by the test circuit, the ROM element 16 is programmed by the reset value RV [1:0] that is determined based on the address data of that high-resistance cell.

Here, the operations of the operation clock CLK, command signal COM, clock signals CLKC0/CLKC1, and reset signal CRST are almost the same as those in FIG. 3. Since the reset value RV [1:0] is "10", the RV value "10" is set by the first clock pulse of the clock signal CLKC1 for the output values CA [0] and CA [1] of the synchronous counter 15a.

Then, the output values CA [0] and CA [1] of the synchronous counter 15a are sequentially incremented to "10", "11", "00" and "01", according to the clock signal CLKC1. Thus, the column selection lines CSL [0] to CSL [3] are activated in the order of CSL [2], CSL [3], CSL [0] and CSL [1].

In this example, the column selection line CSL [3] is activated second. Therefore, it is possible to extend the time to deactivate the word line WL against the memory cell 11 connected to the bit line BLt [3]. Thus, the potential VSN of the storage node SN can be considerably increased, although it does not reach the VBLH potential. Therefore, even if the memory cell 11 is a high-resistance cell, it is possible to prevent that cell from becoming a defective cell.

As explained above, the order of accessing the sense amplifiers 12a to 12d, that is, the order of activating the column selection lines CSL [0] to CSL [3], can be switched according to the reset value RV [1:0]. Thus, it becomes possible to prevent a high-resistance cell from becoming defective without providing a spare cell for replacement. As a result, the yield can be increased without increasing an unnecessary area for providing a spare cell.

In the above-mentioned first embodiment, the column selection line CSL [3] is activated second, but it is of course possible to activate it first (or third). In that case, the reset value RV [1:0] stored in the ROM element 16 is programmed by the RV value "11" (or the RV value "01").

Although the above explanation has been given on the case where a ROM element is provided to store the reset value RV [1:0], it is also possible to configure the device, so that a ROM element stores defective data from a test circuit, and a reset value RV [1:0] corresponding to the defective data is generated. It is also possible to provide a register instead of a ROM element, and generate a reset value RV [1:0] corresponding to the value of that register. It is also allowable to switch directly the reset value RV [1:0], according to the defective data from a test circuit. Particularly, when an electric fuse which can be programmed after packaging the device is used for a ROM element, a high-speed test after packaging the device is possible, and a test coverage can be increased.

Second Embodiment

Figure 5:
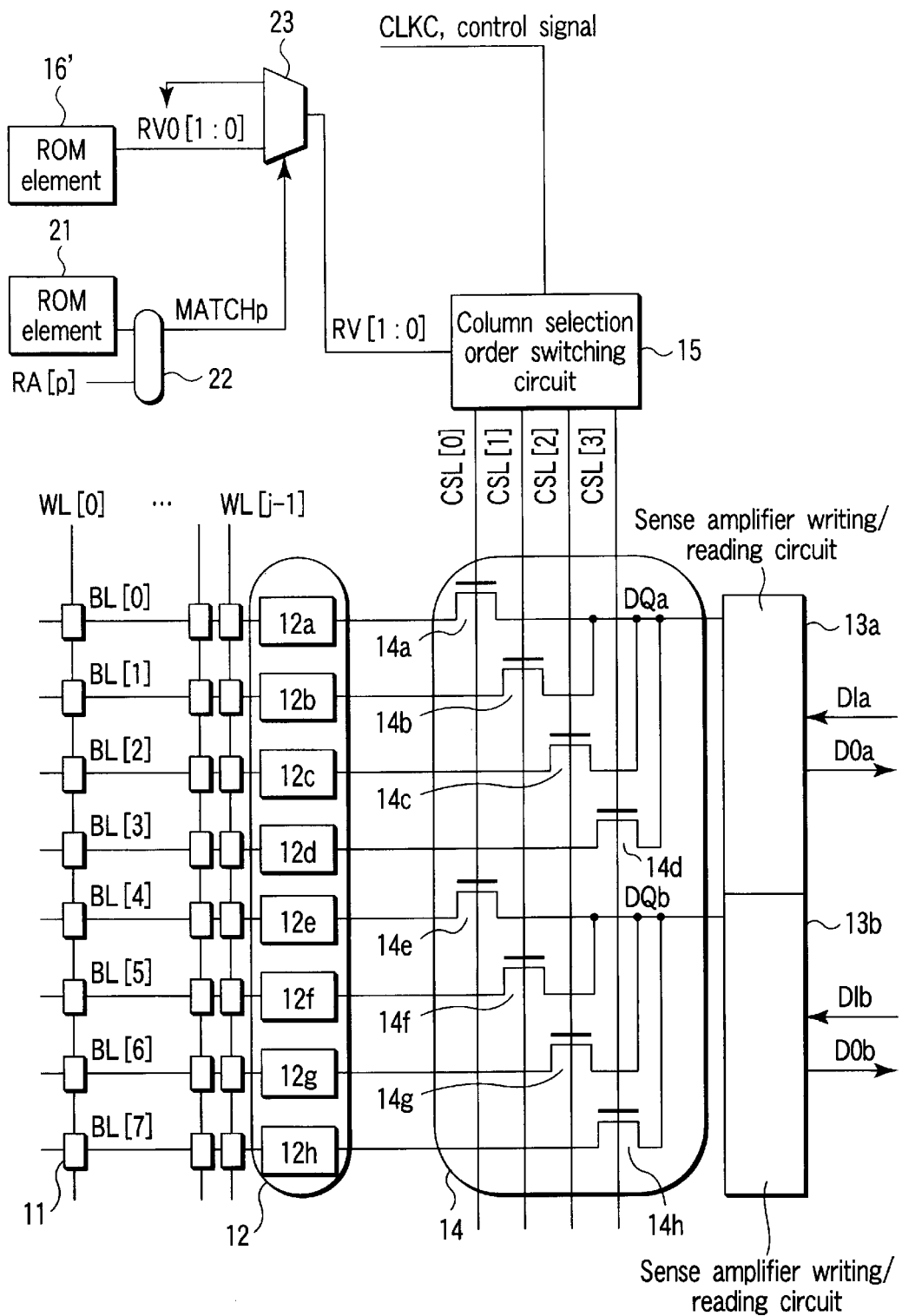
FIG. 5 is a block diagram showing the several parts of a DRAM according to a second embodiment of the present invention.

FIG. 5 is a block diagram showing the several parts of a semiconductor memory device (e.g., DRAM) according to a second embodiment of the present invention. Description will be given on the configuration to further improve the efficiency in preventing a high-resistance cell from becoming defective. The same reference numerals are given to the same components, and the detailed explanation will be omitted.

Namely, a ROM element 16' stores a reset value RV 0 [1:0] like the ROM element 16 shown in FIG. 1. The reset value RV 0 [1:0] is the result of the test performed by a test circuit (not shown) mounted on the same chip, before packaging the device. The reset value is determined based on defective data (the address data of a high-resistance cell).

A ROM element (memory circuit) 21 comprising a nonvolatile memory such as a fuse element and EEPROM, stores a row address corresponding to the above-mentioned defective data. A row address is automatically obtained from the result of the test performed by the test circuit mounted on the same chip before packaging the device, for example.

A comparator 22 compares the row address stored in the ROM element 21, with the input address RA [p] (e.g., p=0, . . . , 63) supplied from outside the device. When the row address coincides with the input address RA [p], the comparator 22 activates a selection signal MATCHp ("HIGH").

A multiplexer 23 selects one of the reset value RV0 [1:0], or a ground potential "LL", according to the selection signal MATCHp. For example, when the selection signal MATCHp has been activated, the reset value RV0 [1:0] from the ROM element 16' is outputted as a reset value RV [1:0] to the column selection order switching circuit 15. On the other hand, when the selection signal MATCHp has been deactivated ("LOW"), a default value "00" corresponding to the above-mentioned ground potential "LL", for example, is outputted to the column selection order switching circuit 15.

Figure 6:
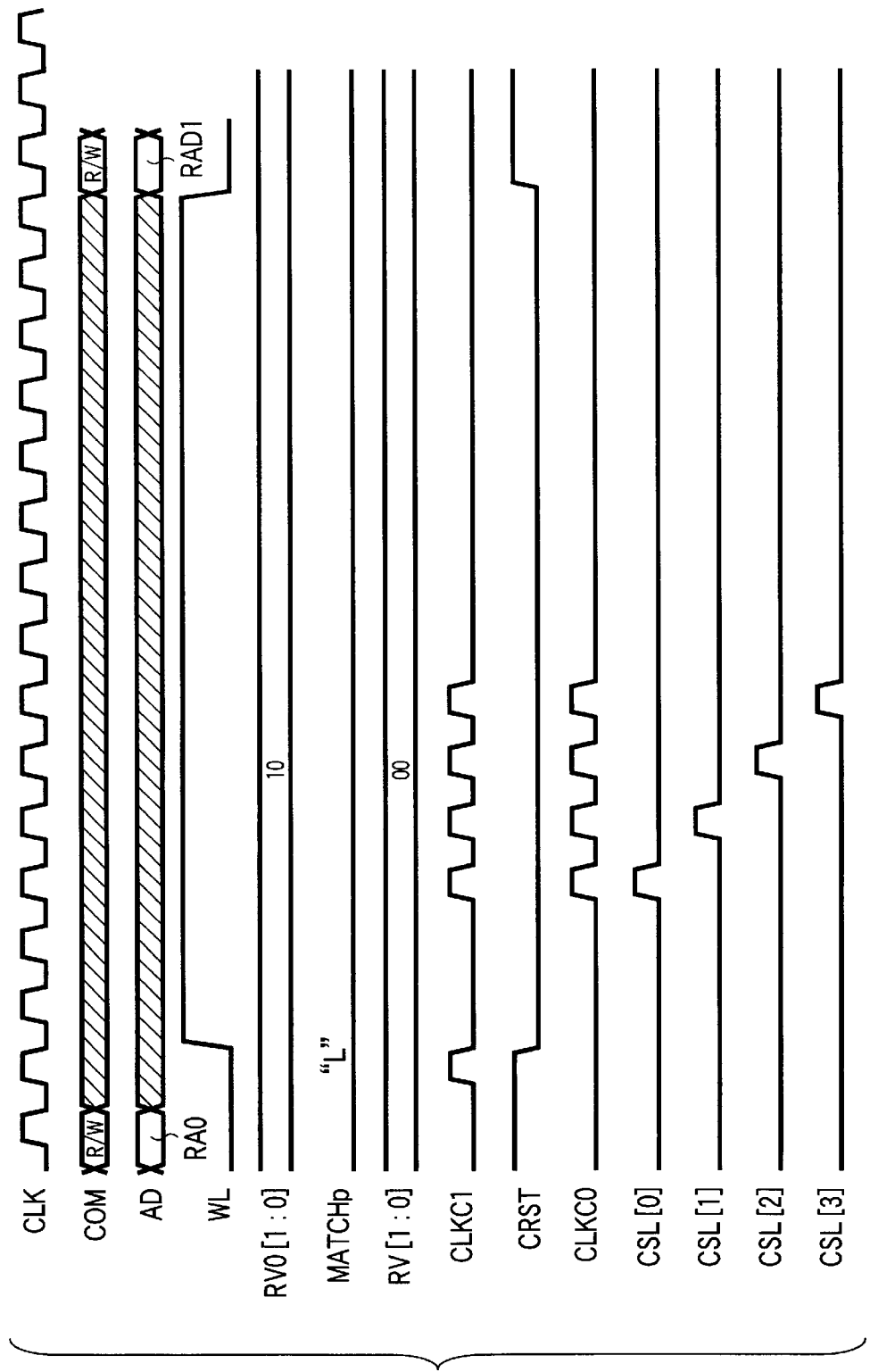
FIG. 6 is a timing chart explaining an example of operation in the DRAM of FIG. 5.
Figure 7:
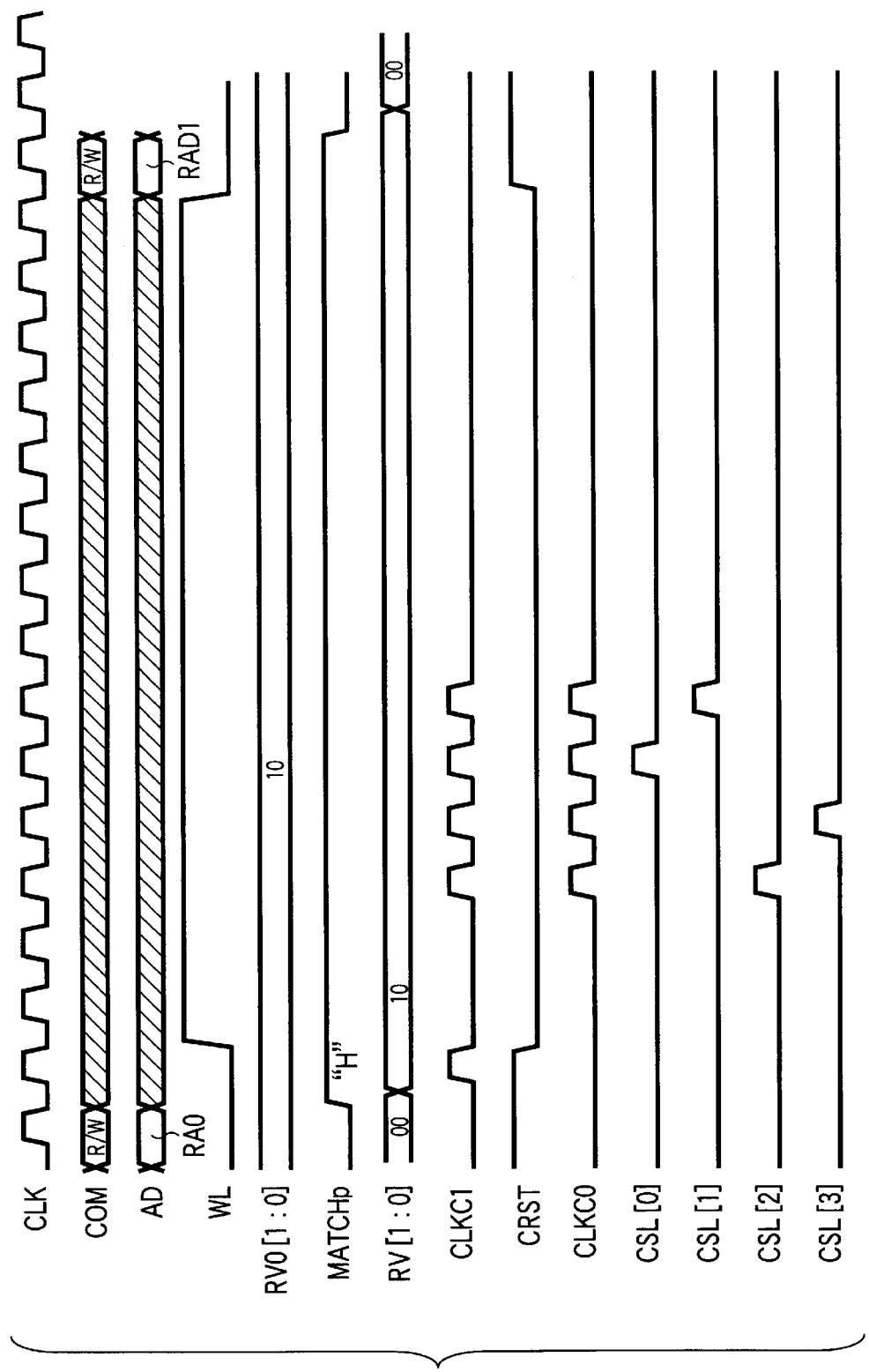
FIG. 7 is a timing chart explaining another example of operation in the DRAM of FIG. 5.

FIG. 6 and FIG. 7 explain the operation of the DRAM with the above-mentioned structure. FIG. 6 shows an example when the input address RA [p] is different from the row address stored in the ROM element 21. FIG. 7 shows an example when the input address RA [p] is the same as the row address stored in the ROM element 21. In the following description, it is assumed that "10" is stored as a reset value RV0 [1:0] of the ROM element 16', and the row address of the defective data corresponding to the RV value "10" is stored as a row address of the ROM element 21.

In FIG. 6 and FIG. 7, CLK is an operation clock necessary for operating the DRAM. COM is a command signal supplied from the outside of the device. A read command (R) or a write command (W) is inputted at a certain timing. AD is a row address to activate.

When the input address RA [p] differs from the row address stored in the ROM element 21, for example, as shown in FIG. 6, the selection signal MATCHp or the output of the comparator 22 remains deactivated. Thus, the reset value RV [1:0] sent to the column selection order switching circuit 15 remains as a default value "00". Therefore, the column selection lines CSL [0] to CSL [3] are selected in the order of CSL [0], CSL [1], CSL [2] and CSL [3], as shown in FIG. 3.

Contrarily, when the input address RA [p] coincides with the row address stored in the ROM element 21, for example, as shown in FIG. 7, the selection signal MATCHp or the output of the comparator 22 is activated. Thus, the reset value RV [1:0] sent to the column selection order switching circuit 15 is set to "10" by the reset value RV0 [1:0]. Thereafter, the output values CA [0] and CA [1] of the synchronous counter 15a are set to "10" by the clock pulse of the clock signal CLKC1. Therefore, the column selection lines CSL [0] to CSL [3] are selected in the order of CSL [2], CSL [3], CSL [0] and CSL [1], as shown in FIG. 4.

As described above, by generating the above reset value RV [1:0], at least two high-resistance cells in the same array can be prevented from becoming defective. Namely, by generating a different reset value RV [1:0] according to the switching of the input address RA [p], the efficiency in preventing the high-resistance cells from becoming defective can be further increased. Particularly, when the reset value RV0 [1:0] and row address are programmed by the instructions from the outside of the device, it is possible to reliably prevent a specific high-resistance cell from becoming defective.

This embodiment is applicable, regardless of which is selected; a default value ("00") or another reset value (e.g., RV value "10"). By increasing the number of the programmed row address and reset value RV0 [1:0], it is also easily possible to configure the device to prevent three or more high-resistance cells from becoming defective.

It is also possible in this embodiment to use a register instead of a ROM element.

Third Embodiment

Figure 8:
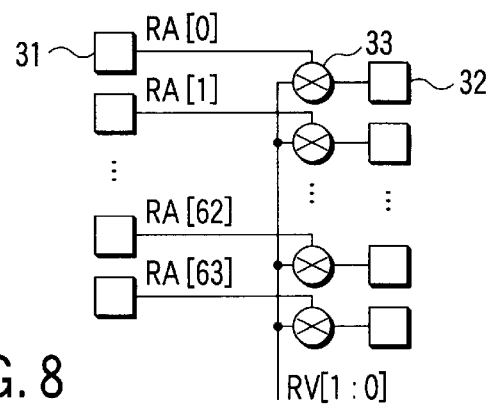
FIG. 8 is a block diagram showing a circuit for forming a reset value, according to a third embodiment of the present invention.

FIG. 8 shows a configuration of a circuit which creates the above-mentioned reset value RV [1:0], according to a third embodiment of the present invention. Description will be given on the configuration where a register is provided for each row decoder and a high-resistance cell can be relieved for each row decoder.

In FIG. 8, a reference numeral 31 denotes a row decoder. Assuming that the number of word lines WL [j] in an array is 512 (j=0, ..., 511), 64 row decoders 31 are provided, for example. Namely, when an input address RA [p] (p=0, 1, ..., 63) is entered, one row decoder 31 corresponding to that input address is selected. Then, among the 512 word lines WL[j], one of eight word lines WL[j] connected to that row decoder 31 is activated.

A reference numeral 32 denotes a data register, and in this example, a data register 32 is provided for each row decoder 31. Each data register 32 can store a 2-bit reset value RV [1:0].

A reference numeral 33 denotes a transfer gate, which outputs a reset value RV [1:0] stored in the corresponding data register 32 to the column selection order switching circuit 15, when the word line WL [j] is activated.

In this configuration, it is possible to relieve a high-resistance cell with a higher defect ratio by a less number of registers. Practically, ⅛×number of columns in 1 array, or in a 2K column array having 512 word lines WL [j], the device can deal with a defect of up to ¹⁄₁₆K.

Fourth Embodiment

Figure 9:
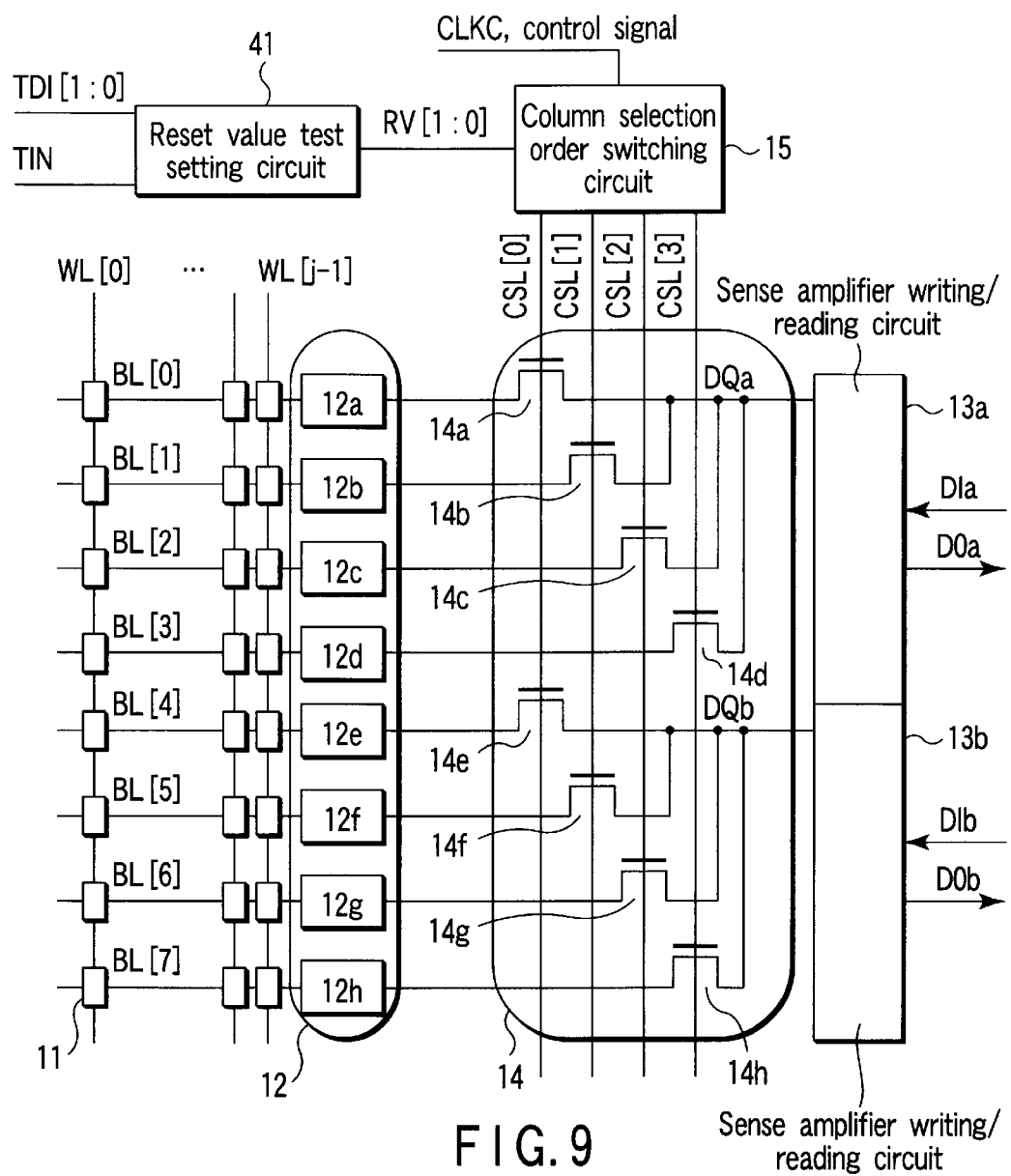
FIG. 9 is a block diagram showing the several parts of a DRAM according to a fourth embodiment of the present invention.

FIG. 9 is a block diagram of a DRAM configured to permit optional setting of a reset value RV [1:0], according to a fourth embodiment of the present invention. The same components as those in FIG. 1 are denoted by the same reference numerals, and detailed description will be omitted.

In this example, a DRAM is provided with a reset value test setting circuit 41 to perform a test by the preset reset value RV [1:0]. The reset value setting circuit 41 is supplied with a test signal TIN and a test value TDI [1:0] from outside the device. The test signal TIN is activated according to the setting of test mode. The test value TDI [1:0] is the data to set an optional reset value RV [1:0]. The reset value test setting circuit 41 has a function of incrementing the set reset value RV [1:0], and a function of cutting the built-in fuse element according to the reset value RV [1:0], for example.

Figure 10:
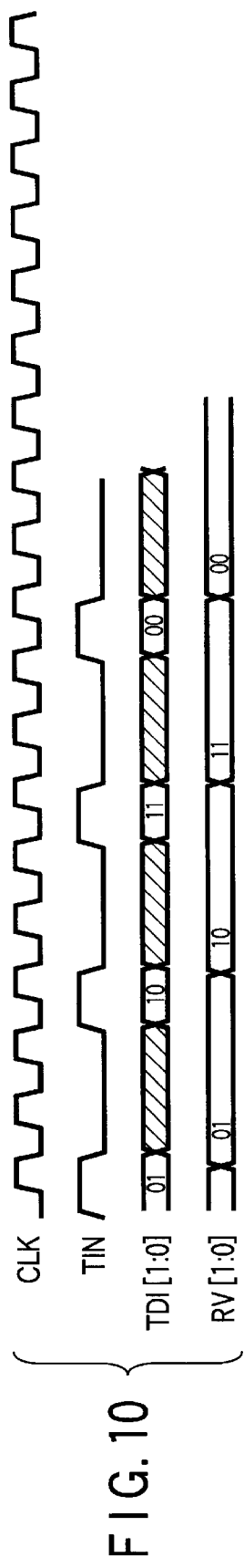
FIG. 10 is a timing chart explaining the operation of a reset value test setting circuit in the DRAM of FIG. 9.

FIG. 10 explains the operation of the above-mentioned reset value test setting circuit 41. A test signal TIN is activated synchronizing with an operation clock CLK. Then, the test value TDI [1:0] at that time is taken as a reset value RV [1:0] into the reset value test setting circuit 41. Then, a test by setting an optional reset value RV [1:0] is enabled.

Figure 11:
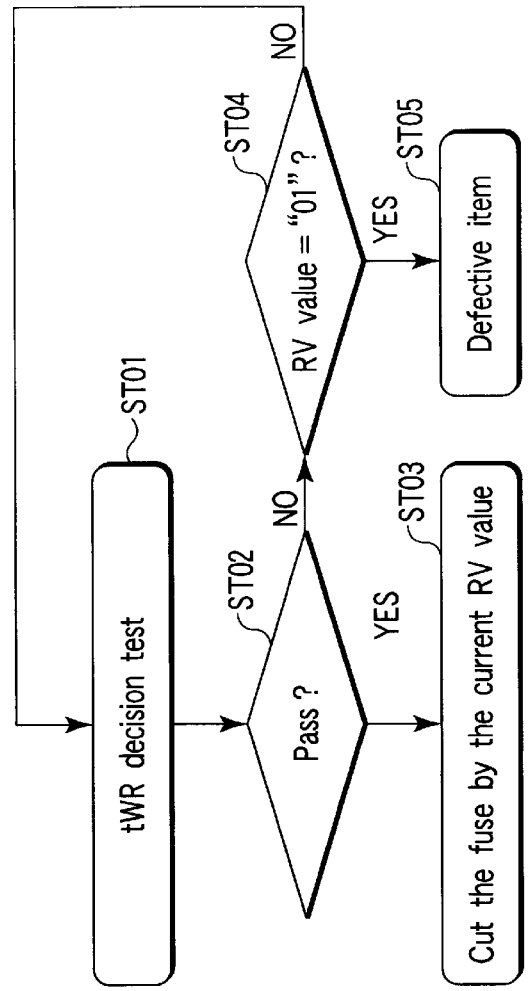
FIG. 11 is a flow chart explaining an example of test operation in the DRAM of FIG. 9.
Figure 12:
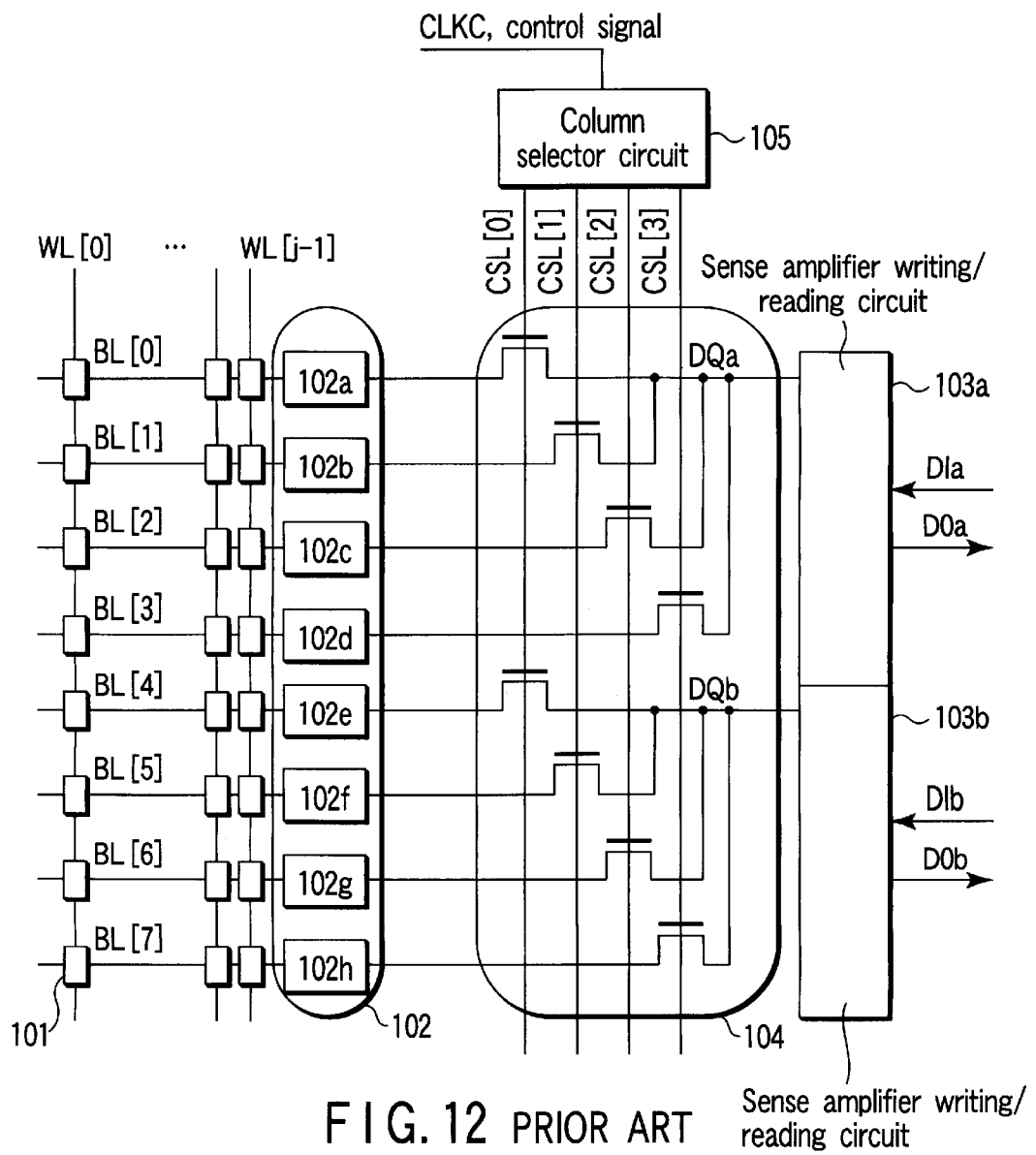
FIG. 12 is a block diagram showing the several parts of the DRAM for explaining the prior art and problems.

FIG. 11 shows an example of a method of testing by setting an optional reset value RV [1:0]. Description will be given on the case where the RV value "01" is now not set as an optional reset value RV [1:0], as shown in FIG. 10.

First, according to the test value TDI [1:0], perform an insufficient writing error test or a tWR decision test by using the reset value RV [1:0] set in the reset value test setting circuit 41. (Step ST01) Namely, output the current set value or the reset value RV [1:0] to the column selection order switching circuit 15, and as described above, activate the column selection lines CSL [0] to CSL [3] in the order of CSL [1], CSL [2], CSL [3] and CSL [0] according to the RV value "01". Then, write the cell data "1" for each memory cell 11, and check the high-resistance cell which causes insufficient writing. When the tWR decision test is passed (step ST02) with the result that "there is no high-resistance cell" or "the high-resistance cell can be prevented from becoming defective", the reset value test setting circuit 41 cuts the built-in fuse element according to the set value (RV value "01"). (Step ST03)

If the above tWR decision test is not passed (step ST02), the reset value setting circuit 41 increments the above reset value RV[1:0](step ST04), and repeats the operations on and after the above step ST01. Namely, according to the incremented RV value "10", activate the column selection lines CSL [0] to CSL [3] in the order of CSL [2], CSL [3], CSL [0] and CSL [1] according to the RV value "01", and write the cell data "1" for each memory cell 11. By changing the order of activating the column selection lines CSL [0] to CSL [3], check whether a high-resistance cell can be prevented from becoming defective.

However, in step ST04, when it is decided that all reset values RV [1:0] are incremented (e.g., RV value "01" when the reset value RV [1:0] is set to "01" as a current set value, as shown in FIG. 10), that chip is handled as a defective item (FAIL). (Step ST05)

With the configuration of the above fourth embodiment, it is possible to set an optional reset value RV [1:0], and the test for checking an insufficient writing error is easily performed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a plurality of memory cells to store data;
   k data input/output lines (k=a natural number);
   a plurality of sense amplifiers which are provided in n number (n=a natural number) for the k data input/output lines, and perform reading and writing cell data for the plurality of memory cells;
   a column selection gate which selects one sense amplifier among the n sense amplifiers, and connects the selected sense amplifier to the corresponding data input/output line;
   a selector circuit which controls the column selection gate, and sequentially selects m sense amplifiers (m=1, 2, ..., n) among the n sense amplifiers; and
   a switching circuit which changes the order of selecting the m sense amplifiers by the selector circuit.

2. The semiconductor memory device according to claim 1, wherein the selector circuit can sequentially access the m sense amplifiers, in a time series without specifying from outside the device.

3. The semiconductor memory device according to claim 1, wherein the selector circuit controls to change the order of selecting columns according to a reset value signal from the switching circuit.

4. The semiconductor memory device according to claim 3, wherein the switching circuit includes a ROM (Read Only Memory) element to store the reset value signal.

5. The semiconductor memory device according to claim 4, wherein the reset value signal is determined based on the address data of a high-resistance cell whose resistance value is higher than that of a normal cell, the resistance of which is detected, by a test circuit, to be defective.

6. The semiconductor memory device according to claim 5, further comprising a memory circuit to store the row address corresponding to the address data; a comparator which compares the row address stored in the memory circuit with an external input address; and a control circuit which controls the output of the reset value signal, according to the comparison result in the comparator.

7. The semiconductor memory device according to claim 6, wherein the reset value signal and the row address can be optionally set by an instruction from the outside the device.

8. A semiconductor memory device comprising:

a plurality of memory cells to store data;

k data input/output lines (k=a natural number);

a plurality of sense amplifiers which are provided in n number (n=a natural number) for the k data input/output lines, and perform reading and writing cell data for the plurality of memory cells;

a column selection gate which selects one sense amplifier among the n number of sense amplifiers, and connects the selected sense amplifier to the corresponding data input/output line;

a selector circuit which controls the column selection gate, and sequentially selects m sense amplifiers (m=1, 2, . . . , n) among the n sense amplifiers; and a switching circuit which changes the order of selecting the m sense amplifiers by the selector circuit;

wherein the order of selecting columns by the selector circuit is changed according to a reset value signal from the switching circuit.

9. The device according to claim 8, wherein the selector circuit can sequentially access the m sense amplifiers in a time series without specifying from outside the device.

10. The device according to claim 8, wherein the reset value signal is determined based on the address data of a high-resistance cell whose resistance value is higher than that of a normal cell, the resistance of which is detected, by a test circuit to be defective.

11. The device according to claim 10, further comprising a memory circuit to store a row address corresponding to the address data; a comparator which compares the row address stored in the memory circuit with an external input address; and a control circuit which controls the output of the reset value signal, according to the comparison result in the comparator.

12. The device according to claim 11, wherein the reset value signal and the row address can be optionally set by an instruction from outside the device.

13. The device according to claim 8, wherein the switching circuit includes a ROM (Read Only Memory) element to store the reset value signal; and the ROM element is programmed before the device is packaged.

14. The device according to claim 8, wherein the switching circuit includes a ROM (Read Only Memory) element to store the reset value signal; and the ROM element is programmed after the device is packaged.

15. A semiconductor memory device comprising:

a plurality of memory cells to store data;

k data input/output lines (k=a natural number);

a plurality of sense amplifiers which are provided in n number (n=a natural number) for the k data input/output lines, and perform reading and writing cell data for the plurality of memory cells;

a column selection gate which selects one sense amplifier among the n number of sense amplifiers, and connects the selected sense amplifier to the corresponding data input/output line;

a selector circuit which controls the column selection gate, and sequentially selects m sense amplifiers (m=1, 2, . . . , n) among the n sense amplifiers; and a setting circuit which sets the order of selecting the m sense amplifiers by the selector circuit;

wherein whether a high-resistance cell with higher resistance than that of a normal cell can be prevented from becoming defective, is tested by changing the order of selecting columns by the selector circuit, according to the set value of the setting circuit.

16. The semiconductor memory device according to claim 15, wherein the selector circuit can sequentially access the m sense amplifiers, in a time series without specifying from outside the device.

17. The semiconductor memory device according to claim 15, wherein the setting circuit includes a ROM (Read Only Memory) element, and when the high-resistance cell can be prevented from becoming defective by the test, programs the ROM element by the set value at that time.

18. The semiconductor memory device according to claim 15, wherein the setting circuit increments the set value at the time the high-resistance cell cannot be prevented from becoming defective by the test.

* * * * *